United States Patent
Yamamoto

(10) Patent No.: US 7,414,321 B2
(45) Date of Patent: Aug. 19, 2008

(54) WIRING CONFIGURATION FOR SEMICONDUCTOR COMPONENT

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 43 days.

(21) Appl. No.: 11/707,338

(22) Filed: Feb. 15, 2007

(65) Prior Publication Data
US 2007/0200256 A1   Aug. 30, 2007

(30) Foreign Application Priority Data
Feb. 24, 2006   (JP) .............................. 2006-048754

(51) Int. Cl.
*H01L 29/40* (2006.01)
(52) U.S. Cl. ...................... 257/784; 257/786
(58) Field of Classification Search ................ 257/784, 257/786
See application file for complete search history.

(56) References Cited

U.S. PATENT DOCUMENTS
6,418,032 B2   7/2002   Hirata et al.

FOREIGN PATENT DOCUMENTS
JP   2001-177040   6/2001

*Primary Examiner*—Douglas M Menz
(74) *Attorney, Agent, or Firm*—Beyer Law Group LLP

(57) ABSTRACT

In a wiring configuration for a semiconductor component, an unused terminal is insulated from a third land via an insulating film, and thus no connecting member (solder) is required for the unused terminal. With this, the third land is not accidentally removed from a circuit board during exchange of the semiconductor component, and the number of defective circuit boards can be reduced. Moreover, the third land for the unused terminal is included in a wiring pattern due to the connection thereof to other lands or other traces for signals and for grounding with a connecting trace. Thus, the widths of lines can be increased, and furthermore, the insusceptibility of transmission lines in high-frequency circuits to noise can be increased.

7 Claims, 3 Drawing Sheets

WIRING CONFIGURATION FOR SEMICONDUCTOR COMPONENT

BACKGROUND OF THE INVENTION

1. Field of the Invention

The present invention relates to wiring configurations for semiconductor components suitable for high-frequency electronic units such as television tuners.

2. Description of the Related Art

A wiring configuration for a known semiconductor component will now be described with reference to FIGS. 5 and 6. FIG. 5 is a plan view of a semiconductor component according to the wiring configuration for the known semiconductor component, and FIG. 6 is a plan view of principal parts of a circuit board according to the wiring configuration for the known semiconductor component. As shown in FIG. 5, a semiconductor component 51 includes a main body 52 and a plurality of terminals 53 provided for the main body 52.

The terminals 53 include a plurality of signal terminals 53a, a plurality of ground terminals 53b, and a plurality of unused terminals 53c. The unused terminals 53c are unnecessary terminals for connection to electrical circuits existing in various other high-frequency electronic units.

As shown in FIG. 6, a circuit board 54 includes a wiring pattern 55. The wiring pattern 55 includes first traces 56 for signals having first lands 56a corresponding to the signal terminals 53a, second traces 57 for grounding having second lands 57a corresponding to the ground terminals 53b, and island-shaped third lands 58a corresponding to the unused terminals 53c.

The semiconductor component 51 is connected to the circuit board 54 by soldering the signal terminals 53a, the ground terminals 53b, and the unused terminals 53c to the first lands 56a, the second lands 57a, and the third lands 58a, respectively. In this manner, the wiring configuration for the known semiconductor component is realized (see, for example, Japanese Unexamined Patent Application Publication No. 2001-177040).

When the electrical circuit of this semiconductor component 51 is broken, the semiconductor component 51 is removed from the circuit board 54 by heating the solder that connects the semiconductor component 51 to the circuit board 54, and then a new semiconductor component 51 is soldered to the circuit board 54.

However, according to the wiring configuration for the known semiconductor component, the areas of the island-shaped third lands 58a to which the unused terminals 53c are soldered are small, and the third lands 58a can be easily accidentally removed from the circuit board 54 when the semiconductor component 51 is removed for exchange, resulting in a large number of defective circuit boards 54. Moreover, since the first traces 56 and the second traces 57 are arranged so as to avoid the island-shaped third lands 58a, the efficiency with which space is used becomes low, and furthermore, the widths of the lines are reduced. Thus, transmission lines in, in particular, high-frequency circuits become susceptible to noise.

SUMMARY OF THE INVENTION

The present invention provides a wiring configuration for a semiconductor component capable of preventing damage to a circuit board and increasing the insusceptibility of transmission lines in the circuit board to noise.

According to one aspect of the invention, a wiring configuration for a semiconductor component includes a semiconductor component including a main body and a plurality of terminals provided for the main body; and a circuit board including a wiring pattern to which the terminals are connected. The wiring configuration is characterized in that the terminals of the semiconductor component include a signal terminal, a ground terminal, and an unused terminal; the wiring pattern includes a first trace for signals having a first land corresponding to the signal terminal, a second trace for grounding having a second land corresponding to the ground terminal, and a third land corresponding to the unused terminal; the third land is connected to the first land, the second land, or one of the traces of the wiring pattern by a connecting trace; and the signal terminal and the ground terminal are connected to the first land and the second land, respectively, using a connecting member while the unused terminal is insulated from the third land using an insulating film.

According to the above-described wiring configuration, no connecting member (solder) is required for the unused terminal since the unused terminal is insulated from the third land via the insulating film. Thus, the third land is not accidentally removed from the circuit board during exchange of the semiconductor component, and the number of defective circuit boards can be reduced. Moreover, the third land for the unused terminal is included in the wiring pattern due to the connection thereof to the other lands or the other traces for signals and for grounding with the connecting trace. This leads to a wiring pattern with high efficiency with which space is used, and furthermore, a wiring pattern with wider lines. Thus, the insusceptibility of transmission lines in high-frequency circuits to noise can be increased.

Moreover, in the above-described wiring configuration, the third land can be connected to the second trace.

According to the above-described wiring configuration, the third land is connected to the second trace by the connecting trace. Therefore, the number of grounding spots can be increased, and furthermore, the width of the grounding line can be increased. Thus, the insusceptibility of the grounding line to noise can be increased, and the electrical shielding can be increased.

Moreover, in the above-described wiring configuration, the third land can be connected to the second land that is disposed adjacent to the third land.

According to the above-described wiring configuration, the second and third lands are connected to each other by the connecting trace. Thus, the number of grounding spots can be increased, and furthermore, the width of the grounding line can be increased. Thus, the insusceptibility of the grounding line to noise can be increased, and the electrical shielding can be increased.

Moreover, in the above-described wiring configuration, the insulating film can be a resist film or a silk film.

According to the above-described wiring configuration, the insulating film can be easily formed, resulting in high productivity.

Moreover, in the above-described wiring configuration, the second trace can extend so as to face the lower surface of the main body, and a metallic body disposed on the lower surface of the main body can be in contact with the second trace.

According to the above-described wiring configuration, the heat of the semiconductor component can be transmitted to the second trace via the metallic body. This leads to high heat-radiating effect.

Moreover, in the above-described wiring configuration, the circuit board disposed under the lower surface of the main body can have a thermal via that is connected to the second trace.

According to the above-described wiring configuration, the heat of the second trace can be radiated through the thermal via. This leads to high heat-radiating effect.

Moreover, in the above-described wiring configuration, the second trace can be connected to a heat-radiating member.

According to the above-described wiring configuration, the heat of the second trace can be radiated via the heat-radiating member. This leads to high heat-radiating effect.

DESCRIPTION OF THE PREFERRED EMBODIMENTS

Figure 1:
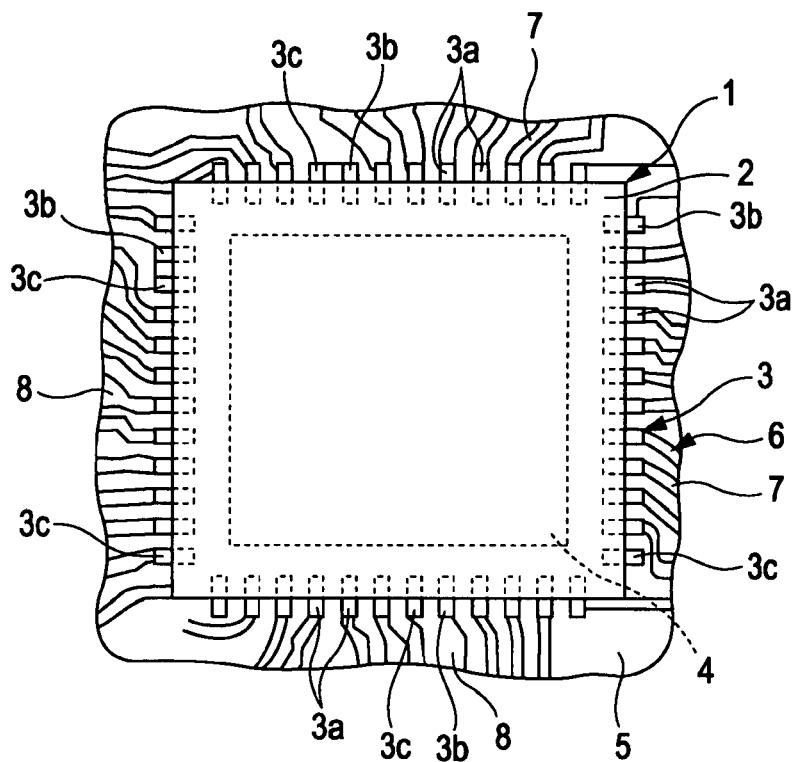
FIG. 1 is a plan view of principal parts according to a wiring configuration for a semiconductor component in accordance with an embodiment of the present invention.

A wiring configuration for a semiconductor component according to an embodiment of the present invention will now be described with reference to FIGS. 1 to 4. A semiconductor component 1 includes a main body 2, a plurality of terminals 3 provided for the main body 2, and a metallic body 4 disposed on the lower surface of the main body 2.

The terminals 3 include a plurality of signal terminals 3a, a plurality of ground terminals 3b, and a plurality of unused terminals 3c. The unused terminals 3c are unnecessary terminals for connection to electrical circuits existing in various other high-frequency electronic units.

Figure 2:
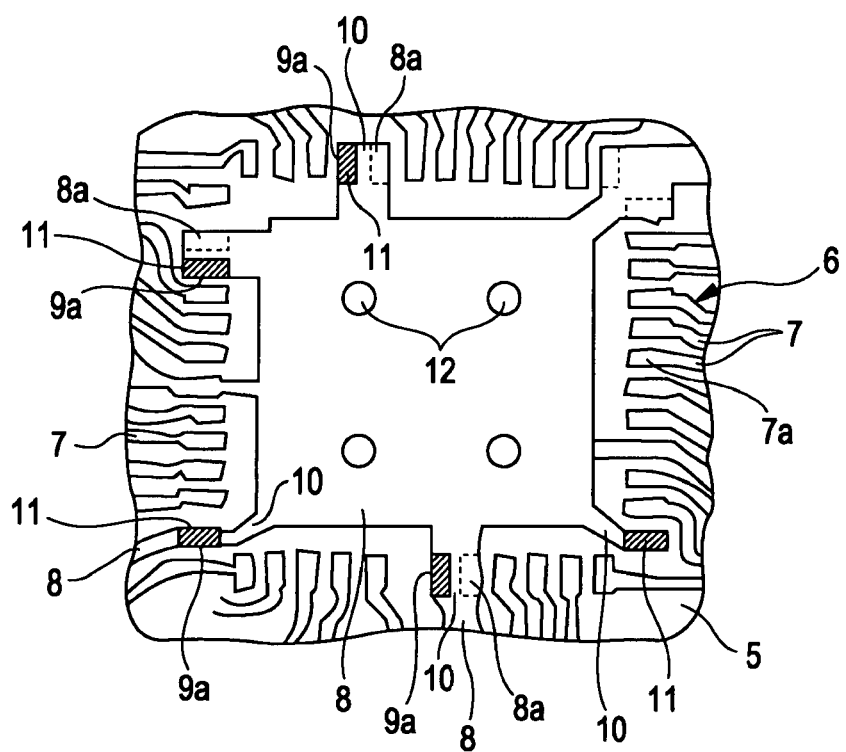
FIG. 2 is a plan view of principal parts of a circuit board according to the wiring configuration for the semiconductor component in accordance with the embodiment of the present invention.
Figure 3:
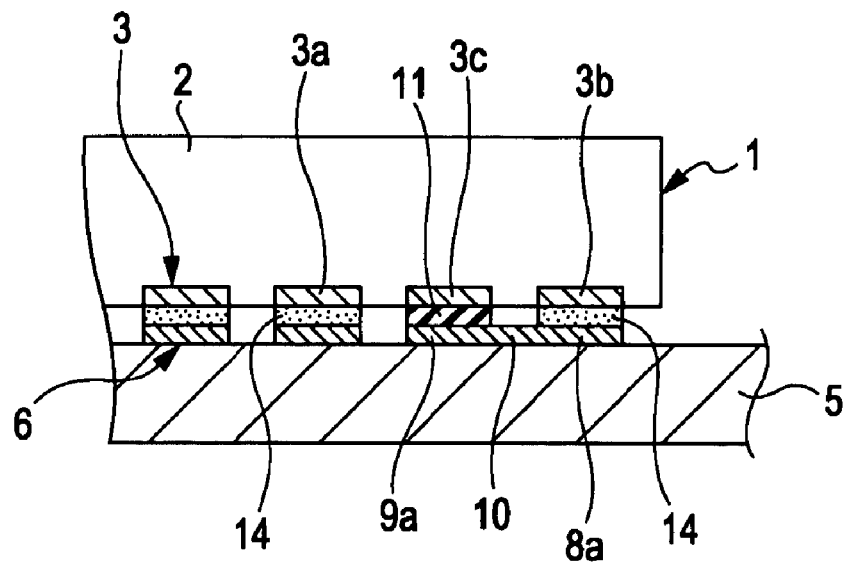
FIG. 3 is an enlarged cross-sectional view of principal parts according to the wiring configuration for the semiconductor component in accordance with the embodiment of the present invention.

As shown in FIG. 2, a circuit board 5 includes a wiring pattern 6. The wiring pattern 6 includes first traces 7 for signals having first lands 7a corresponding to the signal terminals 3a, second traces 8 for grounding having second lands 8a corresponding to the ground terminals 3b, and island-shaped third lands 9a corresponding to the unused terminals 3c. The wiring pattern 6 further includes connecting traces 10 that connect the third lands 9a with the adjacent second lands 8a and/or the second traces 8.

In this embodiment, the third lands 9a are connected to the second lands 8a and/or the second traces 8. However, the third lands 9a can be connected to the first lands 7a and/or the first traces 7.

The circuit board 5 further includes insulating films 11 composed of resist, silk, or the like disposed on the third lands 9a, a plurality of thermal vias 12, and a signal-conducting pattern 13 connected to the thermal vias 12 formed on the lower surface of the circuit board 5. The thermal vias 12 are connected to one of the second traces 8, the second trace 8 facing the metallic body 4 of the main body 2.

The signal terminals 3a and the ground terminals 3b of the semiconductor component 1 are connected to the first lands 7a and the second lands 8a, respectively, using connecting members 14 composed of, for example, solder while the unused terminals 3c are disposed on the insulating films 11.

Even when the semiconductor component 1 is connected to the circuit board 5, the unused terminals 3c are located on the insulating films 11, and are insulated from the second lands 8a and/or the second traces 8. At this time, the metallic body 4 located on the lower surface of the main body 2 is in contact with one of the second traces 8, the second trace 8 facing the metallic body 4.

Figure 4:
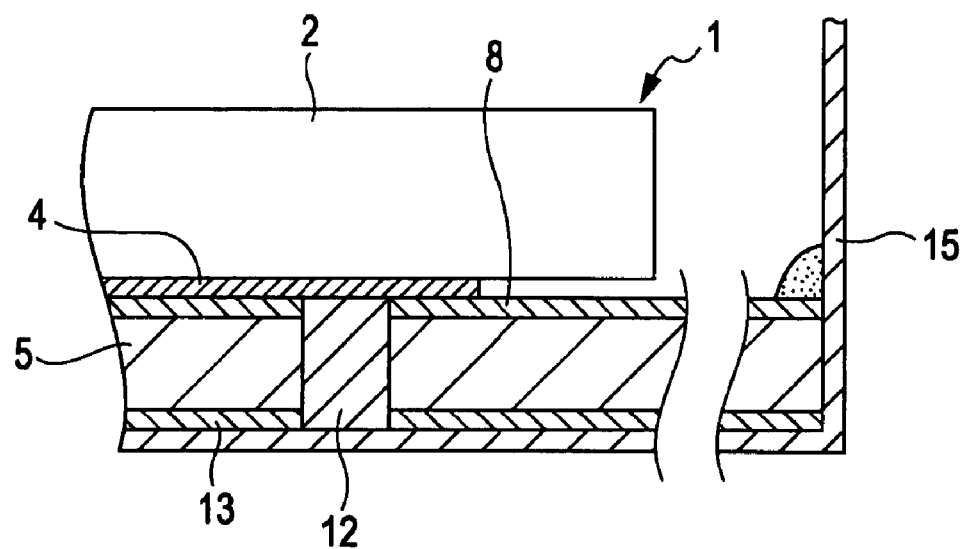
FIG. 4 is an enlarged cross-sectional view of principal parts of a heat-radiating structure according to the wiring configuration for the semiconductor component in accordance with the embodiment of the present invention.
Figure 5:
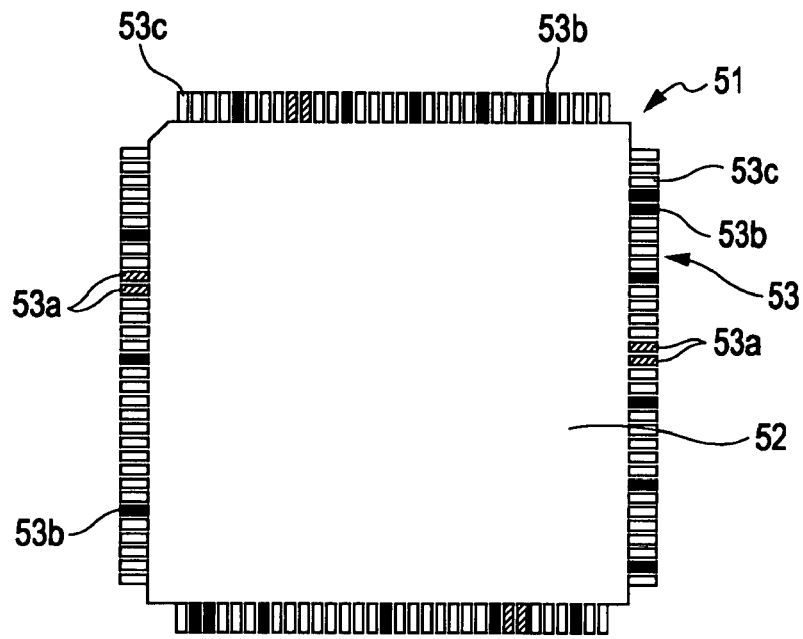
FIG. 5 is a plan view of a semiconductor component according to a wiring configuration for a known semiconductor component.
Figure 6:
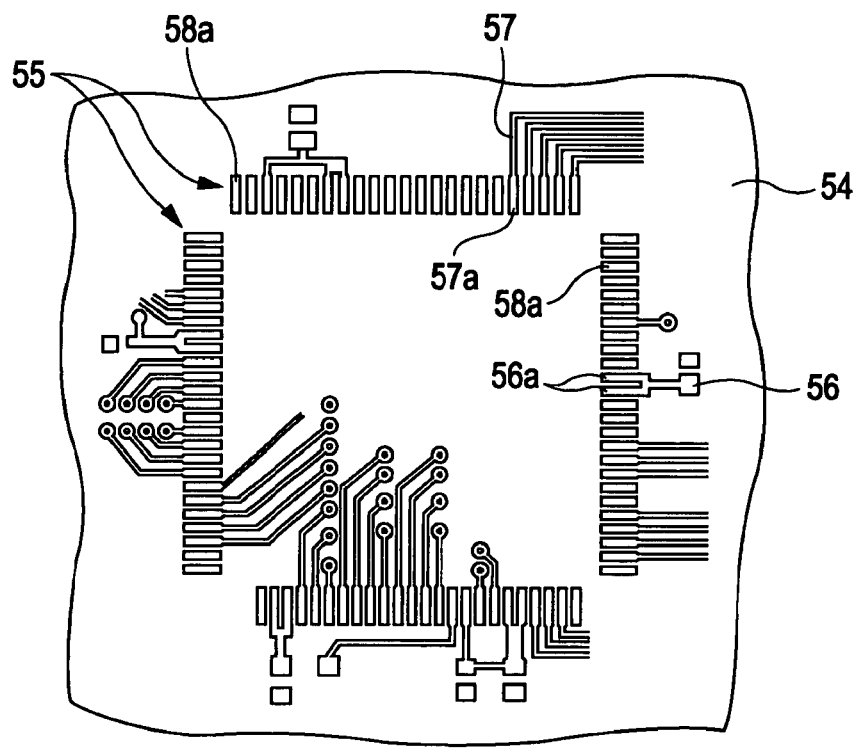
FIG. 6 is a plan view of principal parts of a circuit board according to the wiring configuration for the known semiconductor component.

The circuit board 5 having the semiconductor component 1 attached thereto in this manner is accommodated in a metallic frame 15 serving as a heat-radiating member as shown in FIG. 4. At this time, the second traces 8 are connected to the frame 15, and the thermal vias 12 and the signal-conducting pattern 13 are brought into contact with the frame 15. In this manner, the wiring configuration for the semiconductor component according to this embodiment of the present invention is realized.

Although not shown, various electronic components other than the semiconductor component 1 are mounted on the circuit board 5 so as to form a desired high-frequency electrical circuit. Moreover, the heat-radiating member can be a heat-radiating fin or a heat-radiating metallic plate instead of the frame 15.

What is claimed is:

1. A wiring configuration for a semiconductor component comprising:
    a semiconductor component including a main body and a plurality of terminals provided for the main body; and
    a circuit board including a wiring pattern to which the terminals are connected, wherein
    the terminals of the semiconductor component include a signal terminal, a ground terminal, and an unused terminal;
    the wiring pattern includes a first trace for signals having a first land corresponding to the signal terminal, a second trace for grounding having a second land corresponding to the ground terminal, and a third land corresponding to the unused terminal;
    the third land is connected to the first land, the second land, or one of the traces of the wiring pattern by a connecting trace; and
    the signal terminal and the ground terminal are connected to the first land and the second land, respectively, using a connecting member while the unused terminal is insulated from the third land using an insulating film.

2. The wiring configuration for a semiconductor component according to claim 1, wherein the third land is connected to the second trace.

3. The wiring configuration for a semiconductor component according to claim 1, wherein the third land is connected to the second land that is disposed adjacent to the third land.

4. The wiring configuration for a semiconductor component according to claim 1, wherein the insulating film is a resist film or a silk film.

5. The wiring configuration for a semiconductor component according to claim 1, wherein the second trace extends so as to face the lower surface of the main body, and a metallic body disposed on the lower surface of the main body is in contact with the second trace.

6. The wiring configuration for a semiconductor component according to claim 5, wherein the circuit board disposed under the lower surface of the main body has a thermal via that is connected to the second trace.

7. The wiring configuration for a semiconductor component according to claim 5, wherein the second trace is connected to a heat-radiating member.

* * * * *